US012581588B2

(12) United States Patent
Hasan et al.

(10) Patent No.: US 12,581,588 B2
(45) Date of Patent: Mar. 17, 2026

(54) PRESS-FIT FASTENERS FOR SECURING COMPONENTS TOGETHER

(71) Applicant: Tesla, Inc., Austin, TX (US)

(72) Inventors: Rameez Hasan, San Leandro, CA (US); Christopher Tilton, San Mateo, CA (US); Jonathan Frydman, Mountain View, CA (US)

(73) Assignee: Tesla, Inc., Austin, TX (US)

( * ) Notice: Subject to any disclaimer, the term of this patent is extended or adjusted under 35 U.S.C. 154(b) by 94 days.

(21) Appl. No.: 18/572,728

(22) PCT Filed: Jun. 23, 2022

(86) PCT No.: PCT/US2022/034749
§ 371 (c)(1),
(2) Date: Dec. 20, 2023

(87) PCT Pub. No.: WO2023/278250
PCT Pub. Date: Jan. 5, 2023

(65) Prior Publication Data
US 2024/0292515 A1 Aug. 29, 2024

Related U.S. Application Data

(60) Provisional application No. 63/203,003, filed on Jul. 2, 2021.

(51) Int. Cl.
| | |
|---|---|
| *H05K 1/02* | (2006.01) |
| *H01R 12/52* | (2011.01) |
| *H01R 12/58* | (2011.01) |

(52) U.S. Cl.
CPC .......... *H05K 1/0213* (2013.01); *H01R 12/52* (2013.01); *H01R 12/585* (2013.01); *H05K 2201/10227* (2013.01)

(58) Field of Classification Search
CPC ....... H05K 1/0213; H05K 2201/10227; H01R 12/52; H01R 12/585
(Continued)

(56) References Cited

U.S. PATENT DOCUMENTS

| | | |
|---|---|---|
| 5,066,237 A | 11/1991 | Shiley |
| 6,038,140 A | 3/2000 | Petri |

(Continued)

FOREIGN PATENT DOCUMENTS

| | | | |
|---|---|---|---|
| CN | 211428396 | 9/2020 | |
| EP | 1069651 A1 * | 1/2001 | |
| WO | WO-2008001725 A1 * | 1/2008 | .............. F16B 15/08 |

OTHER PUBLICATIONS

International Search Report and Written Opinion received in PCT/US2022/034749 dated Oct. 14, 2022.

*Primary Examiner* — Andargie M Aychillhum

(74) *Attorney, Agent, or Firm* — Knobbe, Martens, Olson & Bear, LLP

(57) ABSTRACT

Press-fit fasteners for securing components together are provided. In one aspect, an electronic system assembly includes a first component comprising a first hole, a second component comprising a second hole, and a press-fit fastener configured to be inserted into the first hole and the second hole in a single motion. The press-fit fastener is configured to at least contribute to securing the second component to the first component after insertion into the first and second holes. Related press-fit fasteners and methods of manufacture are disclosed.

17 Claims, 24 Drawing Sheets

(58) Field of Classification Search
USPC ......................................................... 361/748
See application file for complete search history.

(56)                      References Cited

U.S. PATENT DOCUMENTS

| | | | |
|---|---|---|---|
| 2004/0002723 A1* | 1/2004 | Ball ......................... | A61F 2/08 |
| | | | 606/180 |
| 2008/0137313 A1* | 6/2008 | Latal ...................... | H05K 7/142 |
| | | | 361/759 |
| 2009/0239398 A1* | 9/2009 | Lynch .................. | H01R 12/585 |
| | | | 29/855 |
| 2010/0254078 A1 | 10/2010 | Zheng et al. | |
| 2016/0111803 A1* | 4/2016 | Wagner ................ | H01R 12/718 |
| | | | 361/783 |
| 2018/0042128 A1 | 2/2018 | Su et al. | |

* cited by examiner

203

300

302

310

312

PRESS-FIT FASTENERS FOR SECURING COMPONENTS TOGETHER

CROSS-REFERENCE TO RELATED APPLICATION

This application is a U.S. national phase application under 35 U.S.C. § 371 of International Application No. PCT/US2022/034749, titled "PRESS-FIT FASTENERS FOR SECURING COMPONENTS TOGETHER," filed Jun. 23, 2022, which claims the benefit of U.S. Provisional Patent Application No. 63/203,003, titled "PRESS-FIT FASTENERS FOR SECURING COMPONENTS TOGETHER," filed Jul. 2, 2021, the disclosures of each of which are hereby incorporated herein by reference in their entireties and for all purposes.

BACKGROUND

Technical Field

The present disclosure relates generally to fasteners used to secure components together, and more specifically to press-fit fasteners.

Description of the Related Technology

Electronic system assemblies can include a plurality of components such as a system on chip (SOC), an application-specific integrated circuit (ASIC), printed circuit board assembly (PCBA), etc., which may be secured together using fasteners. For example, when securing a PCBA to another component (e.g., a heat sink), the fasteners may occupy a certain amount of area of the PCBA, which may otherwise be used for components or wire traces. The installation of certain fasteners, such as screws, may involve comparatively complex movements, which can result in a higher failure rate than desired (e.g., due to cross-threading, stripping, etc.).

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an electronic system assembly that includes a first component comprising a first hole, a second component comprising a second hole, and a press-fit fastener configured to be inserted into the first hole and the second hole in a single motion. At least part of the press-fit fastener is positioned in the first hole and the second hole. The press-fit fastener at least contributes to securing the first component to the second component.

The press-fit fastener can include an upper insertable portion and a lower insertable portion, where the upper insertable portion is configured to engage with the first hole and the lower insertable portion is configured to engage with the second hole. The upper and lower insertable portions of the press-fit fastener can be configured to be compressed when inserted into the first and second holes so as to exert force on the first and second holes. The upper and lower insertable portions of the press-fit fastener can be eyelets.

The press-fit fastener can have at least one cross-sectional dimension that is larger than a diameter of the first hole and is also larger than a diameter of the second hole. The press-fit fastener can have a deformable geometry configured to generate outward force on each of the first and second holes.

The press-fit fastener can have a body sized to prevent the press-fit fastener from being inserted into the first and second holes beyond a defined depth.

The press-fit fastener can have an upper end configured as a grounding point or electrical terminal blade. The press-fit fastener can include electrically conductive material.

The first component can include a plurality of first holes, the second component can include a plurality of second holes, and the assembly can include a plurality of press-fit fasteners each configured to be inserted into a corresponding one of each of the first holes and the second holes in a single motion. Each of the press-fit fasteners can include a portion positioned in the corresponding one of each of the first holes and second holes.

The second component can include a circuit board. The first component can include at least one of: a heat sink, a standoff for a heat sink, a bus bar, or a second circuit board.

Another aspect of this disclosure is a press-fit fastener for securing components together. The press-fit fastener includes a body and a lower portion configured to be inserted into a first hole in a first component and a second hole in a second component in a single motion. The press-fit fastener is configured to at least contribute to securing the first component to the second component when the lower portion of the press-fit fastener is positioned in the first and second holes.

The lower portion can include an upper insertable portion configured to engage with the first hole and a lower insertable portion configured to engage with the second hole. The upper and lower insertable portion can be configured to be compressed when inserted into the first and second holes so as to exert force on the first and second holes. The upper and lower insertable portion can be eyelets.

The press-fit fastener can have at least one cross sectional dimension that is larger than a diameter of the first hole and also larger than a diameter of the second hole. The press-fit fastener can include a post having a rectangular cross-section, where the at least one cross-sectional dimension is measured between opposing corners of the rectangular cross-section.

The press-fit fastener can have a deformable geometry configured to generate outward force on each of the first and second holes when compressed by the first and second holes.

The body can be sized to impede the press-fit fastener from being inserted into the first and second holes beyond a defined depth.

Another aspect of this disclosure is a method of manufacture that includes inserting at least part of a press-fit fastener through a first hole in a first component and a second hole in a circuit board in a single motion. The press-fit fastener at least contributes to securing the circuit board to the first component after insertion into the first and second holes.

The press-fit fastener can include a first insertable portion and a second insertable portion, where the first and second insertable portions of the press-fit fastener are compressed during the inserting so as to exert force on the first and second holes.

The method can further include inserting each of a plurality of additional press-fit fasteners into respective holes of the first component and the circuit board in a single motion.

The innovations described in the claims each have several aspects, no single one of which is solely responsible for its desirable attributes. Without limiting the scope of the claims, some prominent features of this disclosure will now be briefly described.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
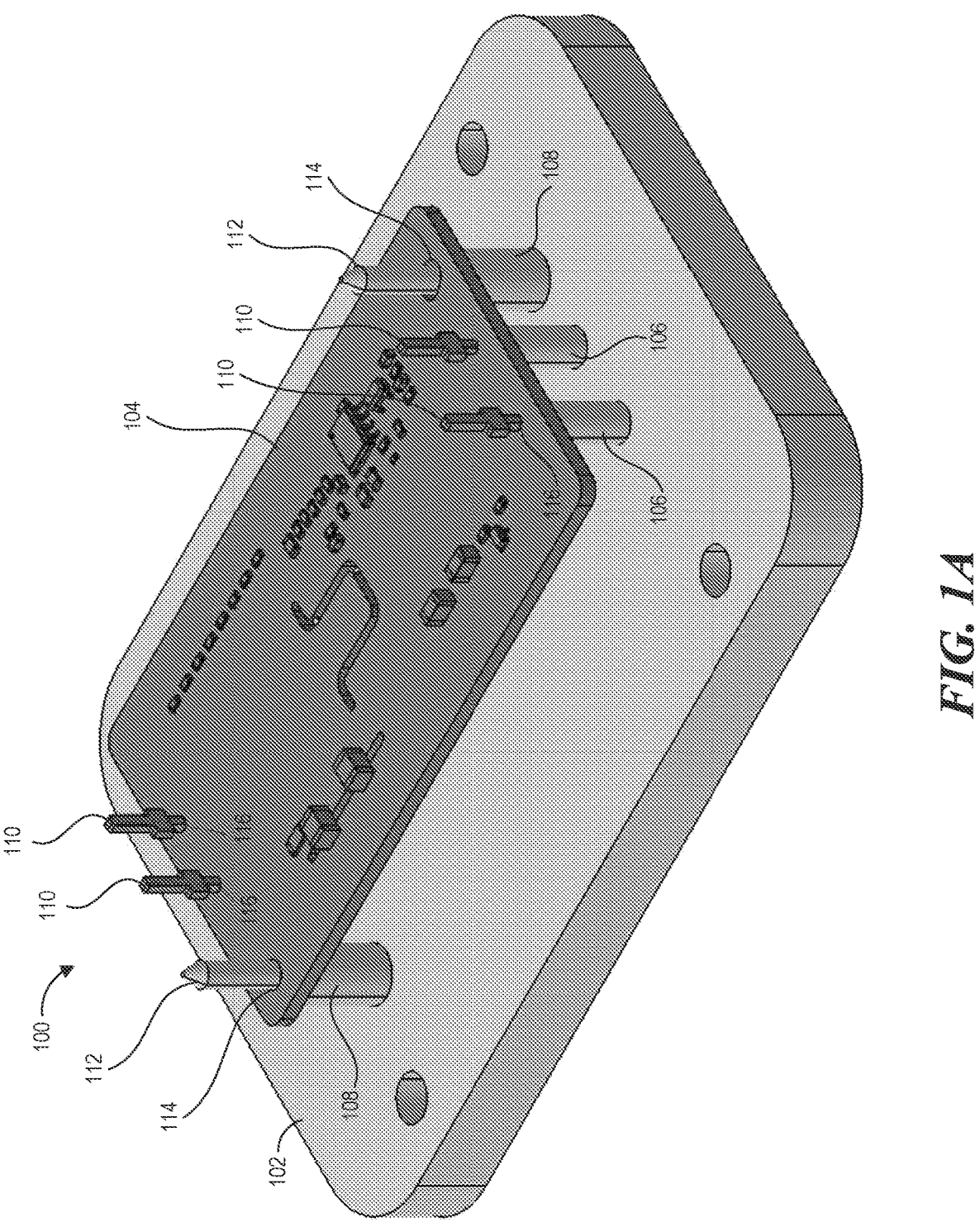
FIG. 1A is a perspective view of an example electronic system assembly including press-fit fasteners in accordance with aspects of this disclosure.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or terms can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects of this disclosure relate to tandem press-fit fasteners which can provide various advantage over other fasteners. For example, the use of press-fit fasteners can leverage the same press-fit machine use for connector blades to install press-fit fasteners as well. Press-fit fasteners disclosed herein can provide dual functionality as a connector blade/connector terminal as well as a fastener. The press-fit fasteners described herein can provide a reliable joint, faster cycle time, and increased board density opportunities compared to other fastener types. Increased board density enables for tighter spacing of components, which results in smaller power printed circuit board assemblies.

One technique for assembling an electronic system assembly (e.g., a processing system or other system including electrical components) is top down manufacturing, which can involve securing the components forming the system starting with the lowest layer in the stack and successively securing the next lowest layer/component to the system using one or more fasteners. A common fastener type which can be used to secure components together is a screw having a male thread configured to engage with a complementary female thread in a matching component configured to receive the screw.

Screws used to fasten components together can have an external threading that is complementary with an internal threading on corresponding standoffs. Screws can be used to fasten a plurality of layers in an electronic system assembly, for example, screws can be used to fasten a circuit board to a heat sink, fasten components to the circuit board, and/or fasten a lid to the system. There are some drawbacks to the use of screws for fasteners in electronic system assemblies. For example, loose screws that are not properly secured into a corresponding standoff may potentially short high voltage components within the system. It can be hard to detect the presence of loose screws once a cover has been secured to the system. There may also be some manufacturing challenges associated with the use of screws including, for example, cross threading, stripping, and/or a slower cycle time. In addition, screws may have a minimum clearance distance specifications from the screw head in order to ensure that the screw does not contact components or wire traces on the circuit board. In addition, the volume or packaging space directly above the screw head is seldom used in various applications.

Despite the drawbacks, there are some advantages to using screws to secure components within the system. For example, screws may be electrically conductive, and thus useful for high current connections and/or grounding connections. If installed properly, screws can provide a connection between components with little to no reliability concerns. Screws are also reusable, and can be removed and replaced without needing to dispose of this screw.

Aspects of this disclosure relate to fasteners which can be used to address one or more of the above drawbacks associated with screw type fasteners. Embodiments of this disclosure relate to press-fit fasteners that can be inserted into a receiving opening shaped such that the fastener can be secured when placed into the opening. There are at least two types of press-fit fasteners which can be used to secure components together. Press-fit fasteners can include a post configured to be inserted into a counterpart opening, in which the post has a larger size than the opening in at least one dimension. Press-fit fasteners can include a deformable geometry configured to generate an outward force on a counterpart opening when compressed by the opening.

The press-fit fasteners described herein can be used to fasten, affix, or "stitch" various different components to each other using a single motion. The components which can be fastened using the press-fit fasteners include, but are not limited to circuit boards (e.g., PCBAs, daughter boards, stacked PCBAs, etc.), heatsinks, busbars, metal plates, sheet metal plates, and/or other metal components. As an example, a press-fit fastener can secure a PCBA to a heat sink. The heat skin can have standoffs. As another example, a press-fit fastener can secure two PCBAs to each other. As one more example, a press-fit fastener can secure a PCBA and a busbar or metal plate. As yet another example, a press-fit fastener can secure sheet metal plates or other metal components to each other.

The press-fit fastener can be used to mechanically fix two or more components to each other. In certain applications, press-fit fasteners can also be used to provide for electrical connections between the components (e.g., grounding points, electrical signal transfer, etc.). The top portion or end portion of the press-fit fastener can also act as an electrical terminal (e.g., blade, sliding contact, etc.). The top portion or end portion of the press-fit fastener can be a variety of shapes and sizes to accommodate different assembly conditions or specifications (e.g., busbars, blade terminals, etc.).

In some embodiments, the press-fit fastener can have an eyelet geometry that can also be varied to accommodate assembly tolerances and design needs (e.g., square cross-section pins, asymmetric tandem eyelets, etc.). The "stitching" operation or single motion used to install the press-fit fastener can be completed in several ways to ensure the proper insertion of the press-fit fastener into the components. Such an operation can include, but is not limited to: using a force and displacement measurement to determine when the first and second eyelets have been fully compressed, using a hard stop on the press-fit fastener to stop the travel of the press-fit fastener once the hard stop comes in contact with the first one of the components, using a set displacement stroke and tight tolerance control of the thickness of the components to insert the press-fit fastener to a specified depth, and/or using computer vision looking from the side of the insertion operation to determine proper insertion depth.

FIG. 1A is a perspective view of an example electronic system assembly 100 including press-fit fasteners 110 in accordance with aspects of this disclosure. Referring to FIG. 1A, the electronic system assembly 100 includes a component 102 (e.g., a heat sink, a standoff for a heat sink, a bus bar, a metal plate, another circuit board such as a daughter board or stacked circuit board, etc.), a circuit board 104, a plurality of standoffs 106 and 108, a plurality of press-fit fasteners 110, and a plurality of posts 112. The standoffs 106 and 108 are configured to space the circuit board 104 away from the component 102. The press-fit fasteners 110 can be used to affix or "stitch" the circuit board 104 to the component 102 in a single motion.

The circuit board 104 includes one or more electronic components thereon, where each of the one or more electronic components includes electronic circuits or circuit element(s). The circuit board 104 can include an alignment hole 114 configured to mate with a post 112 in order to align the circuit board 104 with the component 102. As shown in FIG. 1A, the circuit board 104 includes two alignment holes 114 and the electronic system assembly 100 includes two posts 112 configured to engage with the alignment holes 114. However, the number of posts 112 and corresponding alignment holes 114 is not limited to the embodiment illustrated in FIG. 1A. The electronic system assembly 100 can include no posts 112 and no alignment holes 114, one post 112 and alignment hole 114, or three or more posts 112 and alignment holes 114. The circuit board 104 can further include a plurality of holes 116 which are configured to align with corresponding holes 118 formed in the standoffs 106. The holes 118 are illustrated and labeled in FIG. 1B. Each hole 116 can correspond to a respective hole 118. The plurality of press-fit fasteners 110 can be inserted into the holes 116 and 118 and coupled to the standoffs 106 to secure the circuit board 104 to the component 102.

Figure 1B:
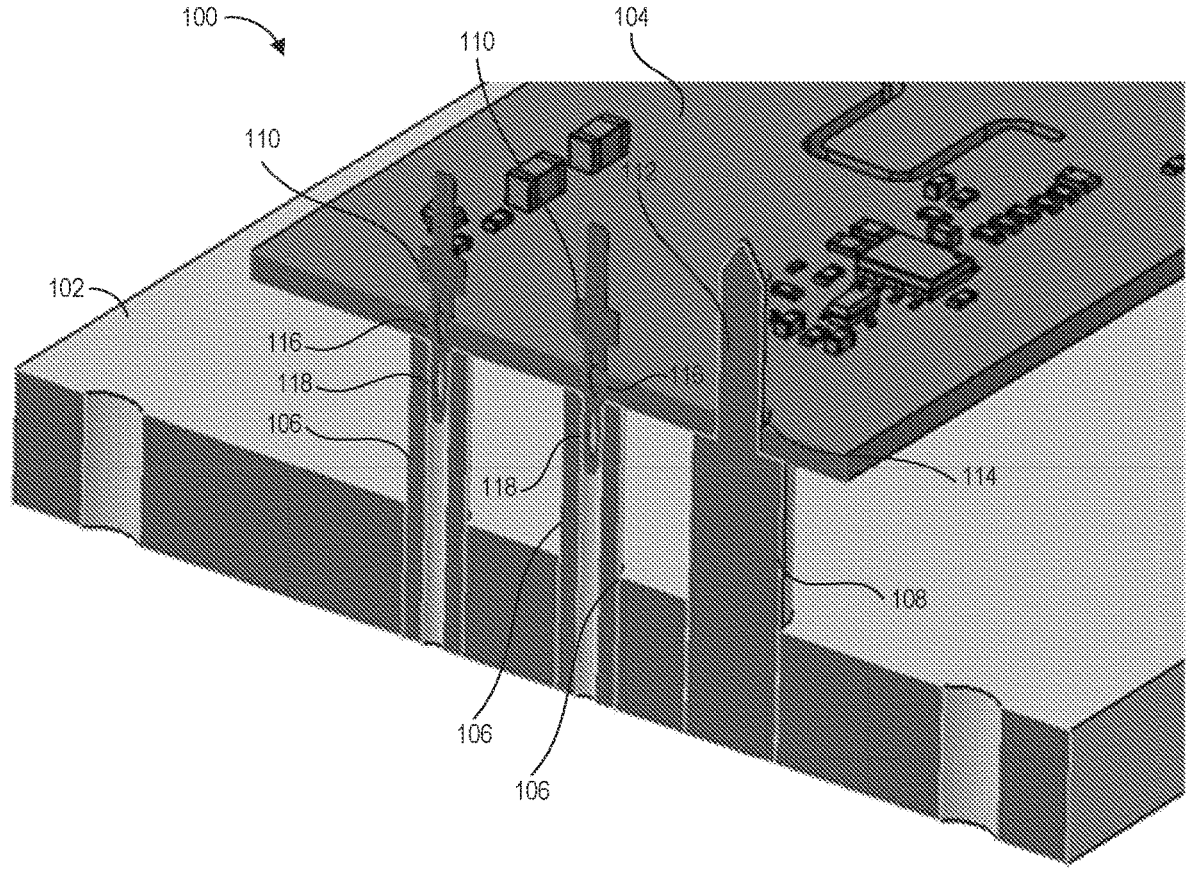
FIG. 1B is a perspective view of an example electronic system assembly including an embodiment of press-fit fasteners in accordance with aspects of this disclosure.

FIG. 1B is a perspective view of an example electronic system assembly 100 including an embodiment of press-fit fasteners 110 in accordance with aspects of this disclosure. Similar to the embodiment of FIG. 1A, the electronic system assembly 100 of FIG. 1B includes a component 102 (e.g., a heat sink, a standoff for a heat sink, a bus bar, another circuit board, etc.), a circuit board 104, a plurality of standoffs 106 and 108, a plurality of press-fit fasteners 110, and a post 112.

By using the press-fit fasteners 110 in place of other fasteners (e.g., screws), the assembly of the electronic system assembly 100 can be performed using a more simple and faster processes of pressing the fasteners 110 into the holes 116 and 118, which can be performed in a single motion. Additionally, manufacturing equipment may have a press-fit machine used to install connector blades, which can be used for installation of the press-fit fasteners 110 as well. The use of press-fit fasteners 110 can provide one or more of a reliable joint, a faster cycle time, and an opportunity for an increased board density. In one example, a screw used for fastening a circuit board can have a diameter of about 6.275 mm, while the width of the head of the press-fit fastener (e.g., see the head 302 of FIG. 3A where the width is measured from left to right in the figure) in some embodiments may be less than about half the diameter of the screw. Thus, the area of the circuit board 104 occupied by the press-fit fasteners 110 may be significantly smaller than a similar circuit board configured to be secured to a component using other fasteners and the space saved by using press-fit fasteners 110 can be used for placing additional components/traces increasing the board density. The press-fit fasteners 110 can be formed of an electrically conductive material. According, such press-fit fasteners 110 can form electrical connections between components secured with the press-fit fasteners 110 and with components in electrical contact with the exposed press-fit fastener head (cross-shaped or otherwise). An electrically conductive press-fit fastener 110 can carry a signal between components. An electrically conductive press-fit fastener 110 can provide a ground connection between components.

With reference to FIG. 1B, the press-fit fastener 110 includes two eyelets arranged adjacent to each other. Each of the eyelets of the press-fit fastener 110 is an insertable portion that can be compressed during insertion so as to exert force on a hole. The two eyelets of the press-fit fastener 110 can be respectively configured to engage with one of the holes 116 in the circuit board 104 and a hole 118 in one of the standoffs 106. The eyelets of the press-fit fastener 110 can be configured to be compressed when inserted into the holes in the circuit board 104 and standoff 106 so as to exert a force on the holes, thereby securing the circuit board 104 to the component 102.

Figure 1C:
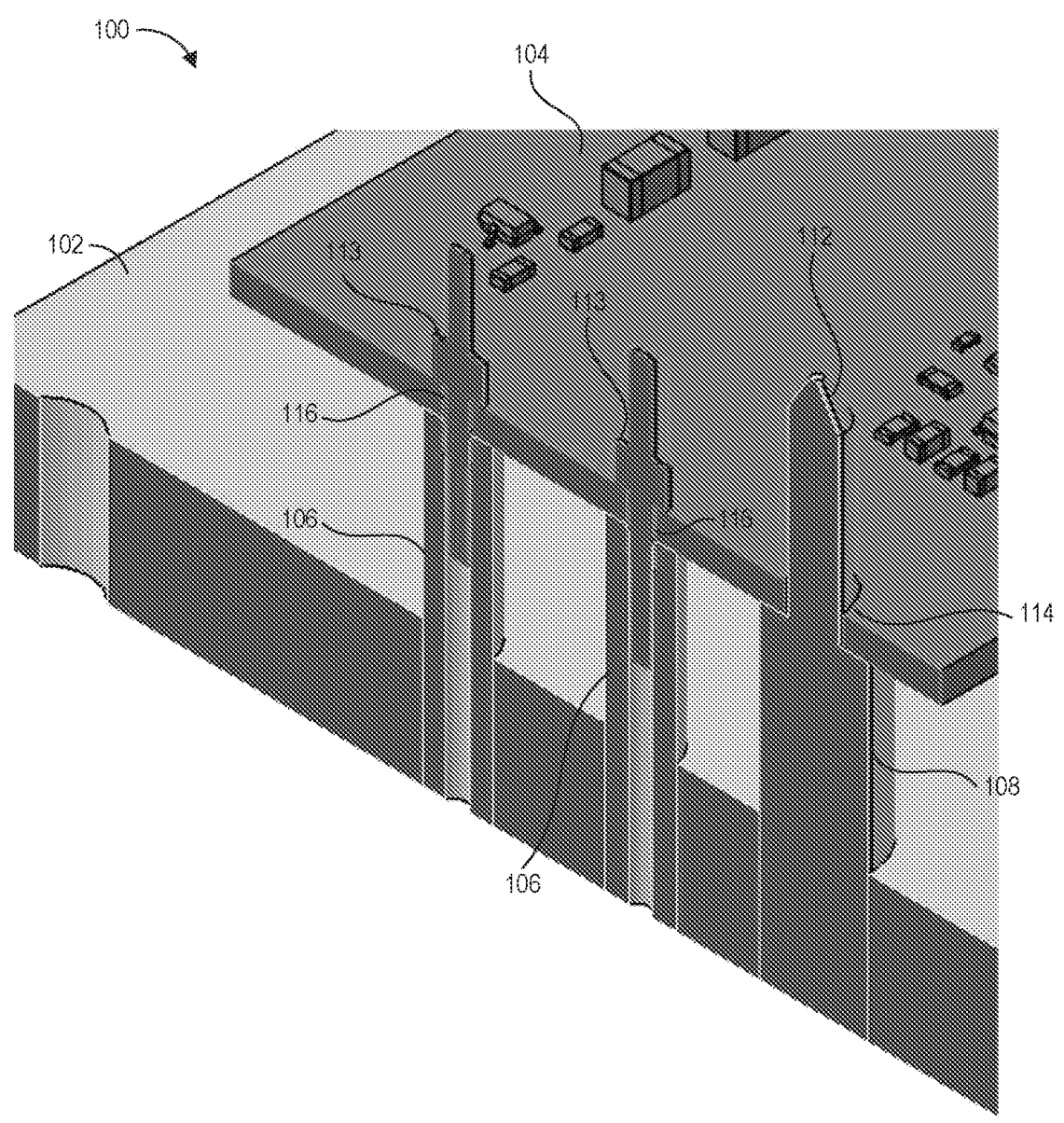
FIG. 1C is a perspective view of an example electronic system assembly including another embodiment of press-fit fasteners in accordance with aspects of this disclosure.

FIG. 1C is a perspective view of an example electronic system assembly 100 including another embodiment of press-fit fasteners 113 in accordance with aspects of this disclosure. Similar to the embodiment of FIG. 1A, the electronic system assembly 100 of FIG. 1C includes a component 102 (e.g., a heat sink, a standoff for a heat sink, a bus bar, another circuit board, etc.), a circuit board 104, a plurality of standoffs 106 and 108, a plurality of press-fit fasteners 113, and a post 112. The electronic system assembly 100 of FIG. 1C includes press-fit fasteners 113 in place of the press-fit fasteners 110 of the electronic system assembly 100 of FIG. 1A.

With reference to FIG. 1C, the press-fit fastener 113 includes a post having a rectangular or square cross-section.

The press-fit fastener 113 further includes a cross-sectional dimension measured between opposing corners of the cross-section that is larger than a diameter of each of the hole 116 in the circuit board 104 and a hole in the standoff 106. The press-fit fastener 113 can have a deformable geometry configured to generate an outward force on each of the holes in the circuit board 104 and the standoff 106 when compressed by the holes.

Figure 2A:
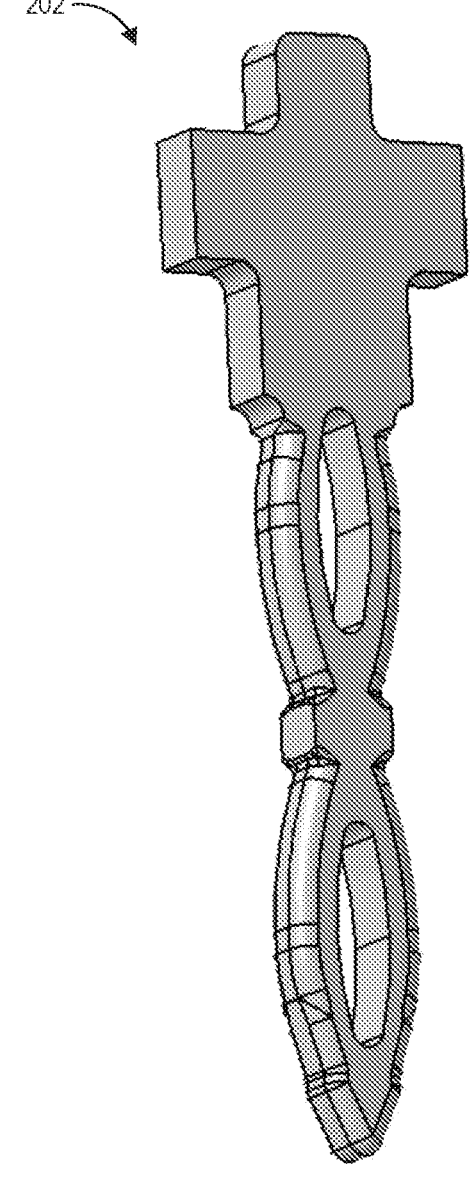
FIGS. 2A-2D illustrate embodiments of press-fit fasteners in accordance with aspects of this disclosure.
Figure 2B:
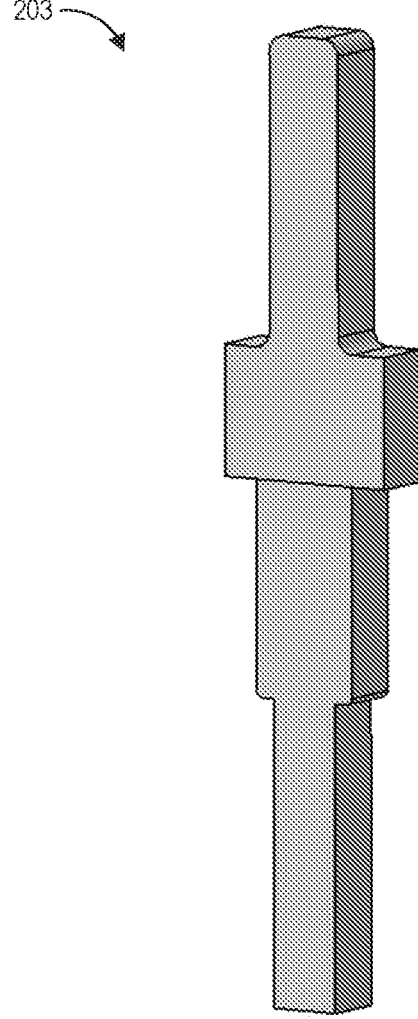
Figure 2C:
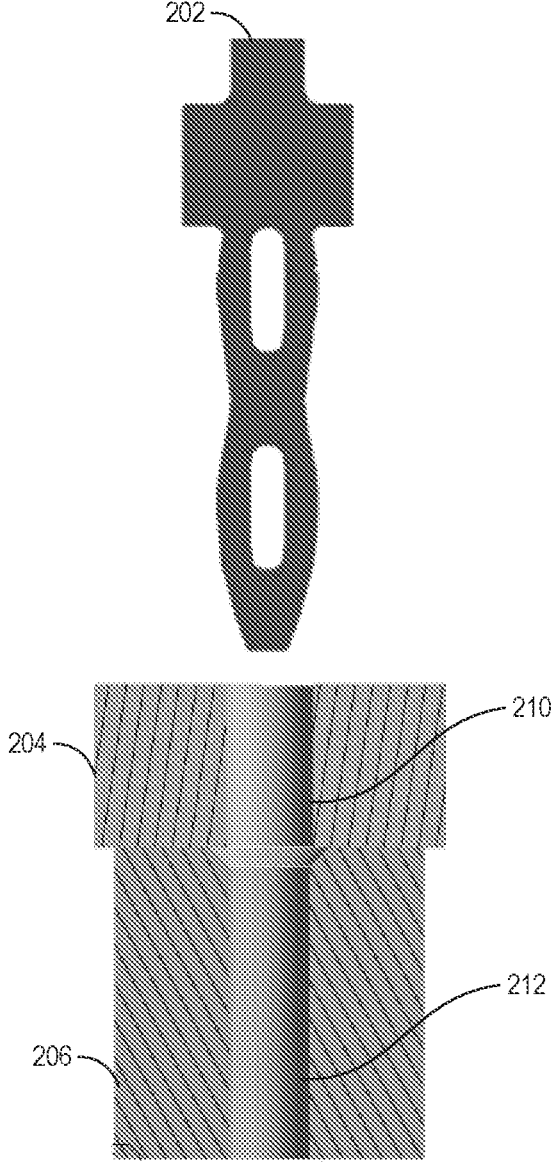
Figure 2D:
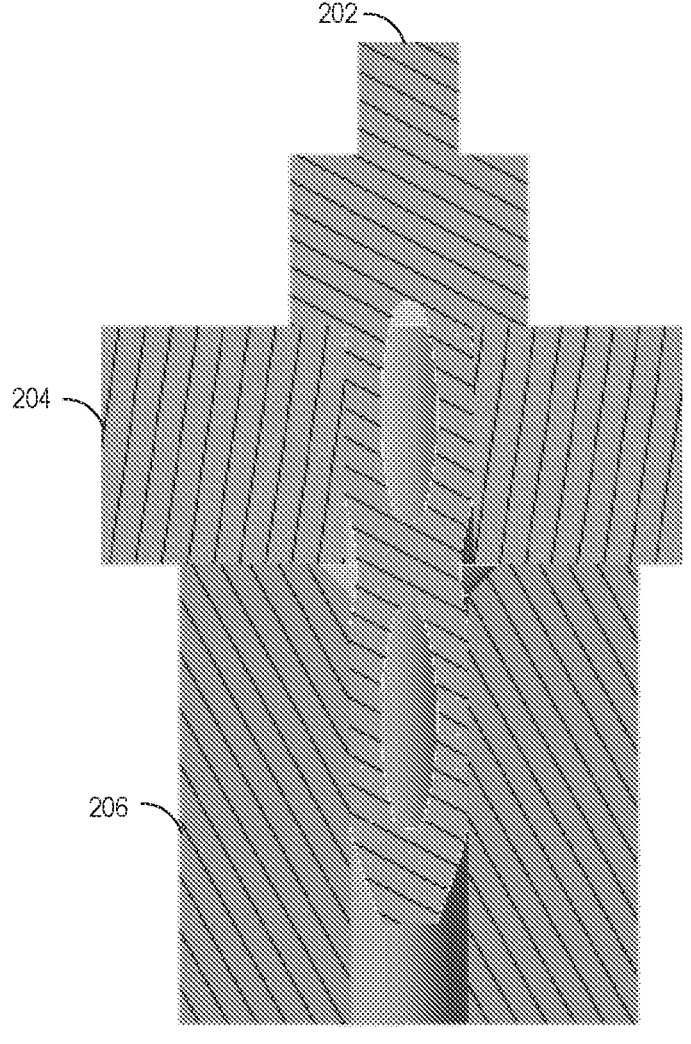

FIGS. 2A-20 illustrate embodiments of press-fit fasteners in accordance with aspects of this disclosure. FIG. 2A illustrates a perspective view of an embodiment of a press-fit fastener 202. FIG. 2B illustrates a perspective view of another embodiment of a press-fit fastener 203. FIG. 2C illustrates the press-fit fastener 202 arranged above a circuit first component 204 and a second component 206 prior to securing the components 204 and 206 together. The first component 204 can be a circuit board, for example. FIG. 2D illustrates the first component 204 secured to the second component 206 via the press-fit fastener 202. The press-fit fastener 202 of FIG. 2A may be similar to the press-fit fastener 110 illustrated in FIG. 1B, and the press-fit fastener 203 of FIG. 2B may be similar to the press-fit fastener 113 illustrated in FIG. 1C.

Although the FIG. 2A embodiment is similar to the embodiment illustrated in FIGS. 2C and 2D, the press-fit fastener 202 of FIG. 2A may have a differently shaped head or body (e.g., a cross-shaped head). The head geometry can be designed for use as a blade terminal or another electrical contact for a tertiary connection (e.g., to a connector on a wire harness), for example as shown in FIGS. 7A-8C, while the inner cross-sectional shapes of the eyelets are different between the FIG. 2A embodiment and the embodiment illustrated in FIGS. 2C and 2D. However, FIGS. 2A, 2C, and 2D will be described together herein due to their similarity.

The press-fit fastener 202 includes two eyelets arranged adjacent to each other, where the eyelets have substantially the same size and shape. As shown in FIGS. 2C and 2D, the first component 204 includes a first hole 210 and the second component 206 includes a second hole 212. The second component 206 can be any suitable component, such as a heat sink, a bus bar, a circuit board, or a standoff. The press-fit fastener 202 can be inserted into first and second holes 210 and 212 via a single pressing operation. Eyelet size and shape can be the same for both eyelets. Alternatively, eyelet size and/or shape can differ between the two eyelets to accommodate mating holes.

The press-fit fastener 203 of FIG. 2B includes a main body portion and a lower portion sized to fit within the holes of the components being secured by the press-fit fastener 203. The upper portion of the press-fit fastener 203 may be sized to prevent or impede the press-fit fastener 203 from being inserted into a hole beyond a defined depth. At least one cross-sectional dimension of the lower portion of the press-fit fastener 203 may be larger than a corresponding dimension of the hole prior to insertion into the hole. The lower portion of the press-fit fastener 203 includes two insertable portions that can each be compressed during insertion so as to exert force on a hole. Additional details of an embodiment of the press-fit fastener 203 of FIG. 2B are described below in connection with FIGS. 5A-5C.

FIGS. 2C and 2D illustrate a method of manufacture using a press-fit faster 202. These drawings illustrate inserting part of the press-fit fastener 202 through a first hole 210 in a first component 204 and a second hole 212 in a second component 206 in a single motion. After insertion into the first hole 210 and the second hole 212, the press-fit fastener 202 at least contributes to securing the components 204 and 206 together. As illustrated, the press-fit faster 202 includes a first insertable portion and a second insertable portion, where the first and second insertable portions are compressed during insertion so as to exert force on the first and second holes 210 and 212, respectively. The method can include inserting a plurality of additional press-fit fasteners into additional holes of the components 204 and 206 such that a plurality of the press-fit fasteners secure the components 204 and 206 together. Each of these additional press-fit fasteners can be inserted into at least two holes in a single motion. Any suitable number of press-fit fasteners can be used to secure two components together. For example, FIG. 1A illustrates an embodiment with 4 press-fit fasteners.

Figure 3A:
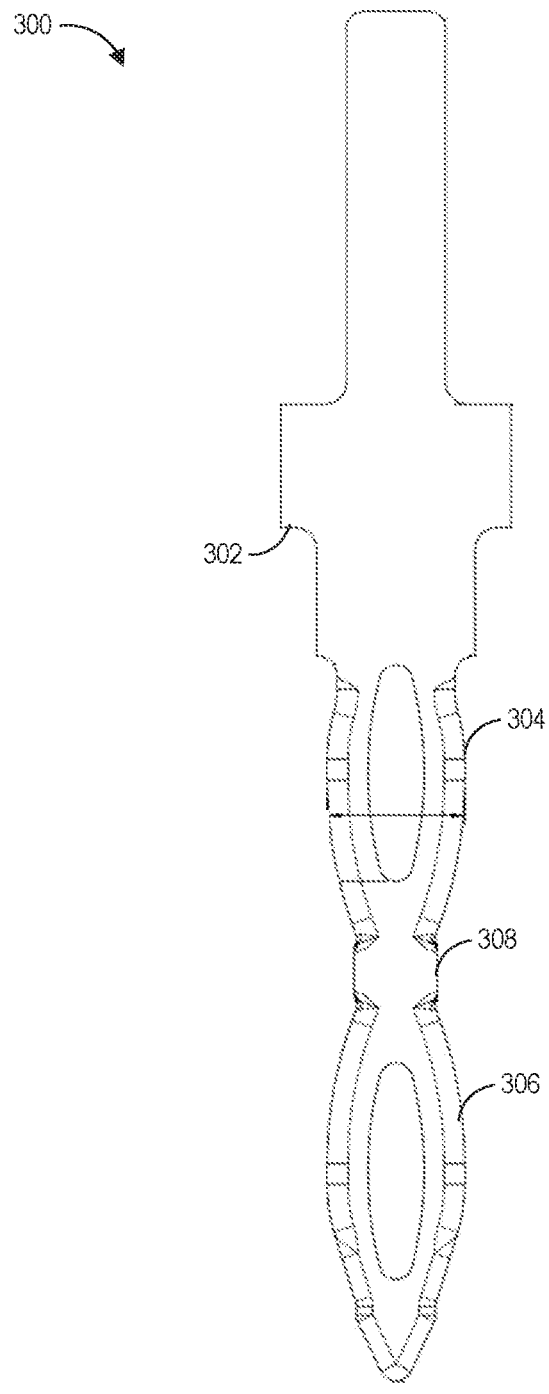
FIGS. 3A and 3B illustrate another embodiment of a press-fit fastener in accordance with aspects of this disclosure.
Figure 3B:
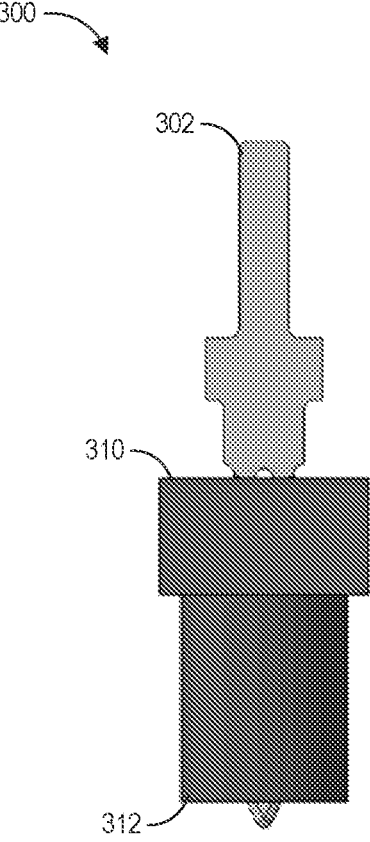

FIGS. 3A and 3B illustrate another embodiment of a press-fit fastener 300 in accordance with aspects of this disclosure. FIG. 3A illustrates a plan view of the press-fit fastener 300. FIG. 3B illustrates the press-fit fastener 300 installed to secure a circuit board 310 to the component 312.

With reference to FIG. 3A, the press-fit fastener 300 can include a body (or head) 302 and a lower portion including two eyelets 304 and 306 connected via a joint (or ball) 308. The body 302 of the press-fit fastener 300 may be sized to prevent the press-fit fastener 300 from being inserted into the holes of components beyond a defined depth (e.g., the length of the lower portion). The upper portion of the body 302 can additionally function as a grounding point or electrical terminal blade for an external connector assembly or harness. As shown in FIG. 38, the thicknesses of the circuit board 310 and the component 312 may be different. Accordingly, the length of the first eyelet 304 may be different (e.g., shorter as illustrated) than the length of the second eyelet 306. The length of the first eyelet 304 can correspond to the thickness of the circuit board 310, and the length of the second eyelet 306 can correspond to the thickness of the component 312. In some implementations, a portion of the lower end of the press-fit fastener 300 (e.g., a lower end of the eyelet 306) may protrude from the bottom of the component 312 when the press-fit fastener 300 is installed.

Figure 4A:
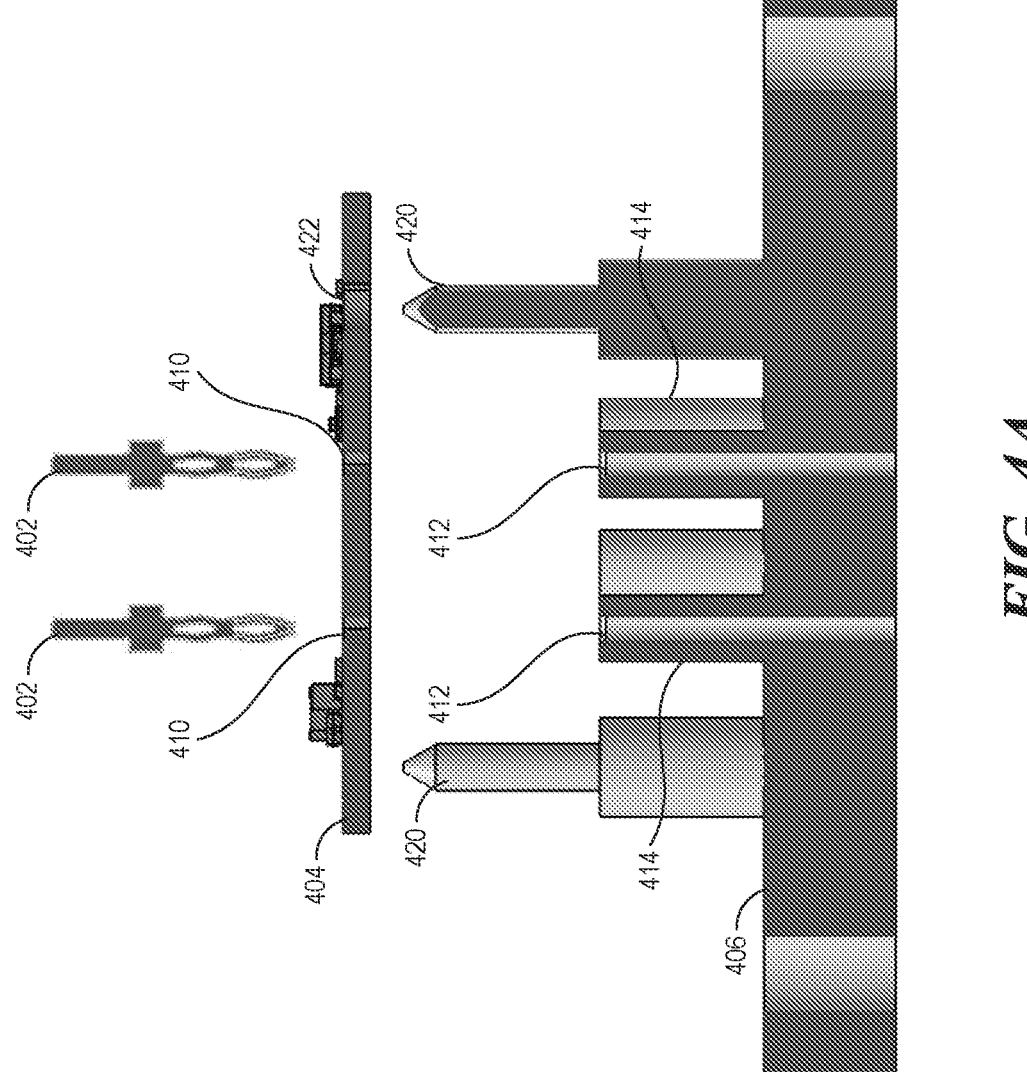
FIGS. 4A-4H illustrate embodiments of assemblies that include press-fit fasteners and components thereof in accordance with aspects of this disclosure.
Figure 4B:
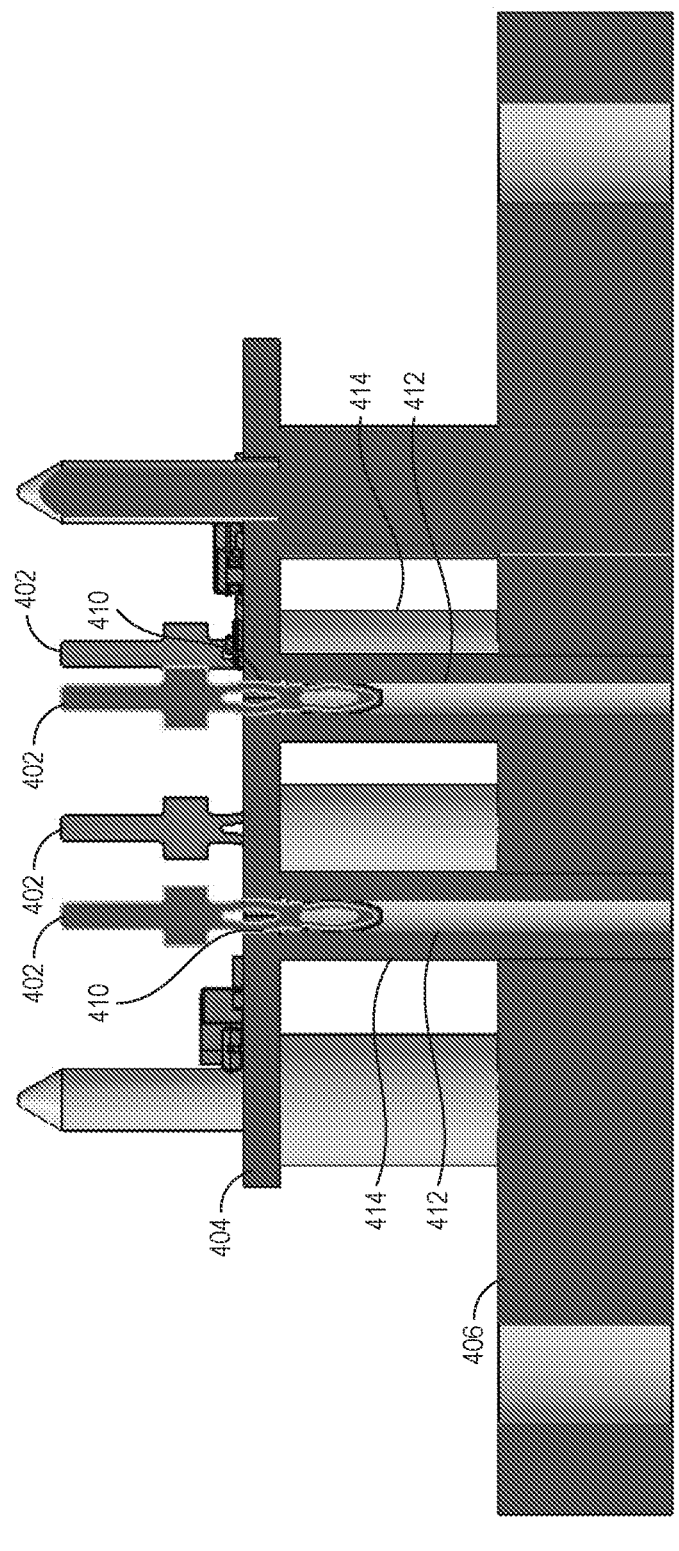
Figure 4C:
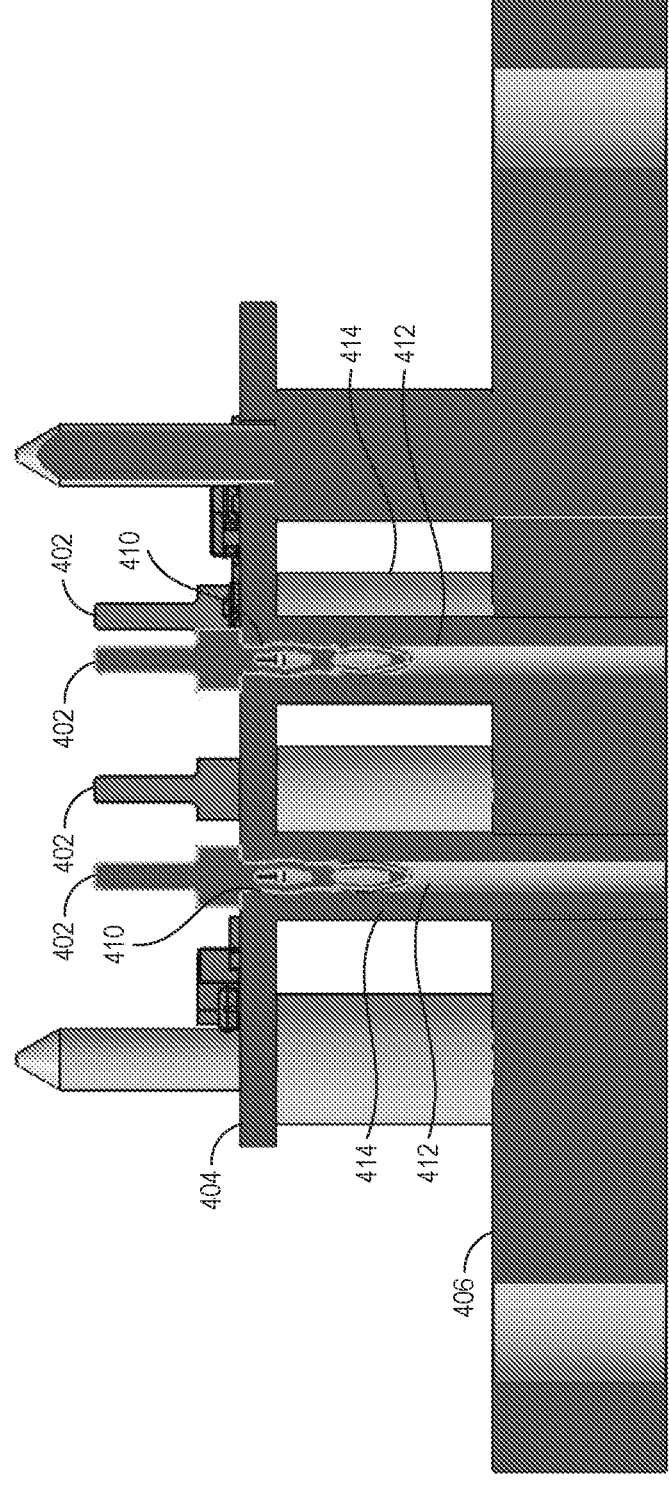
Figure 4D:
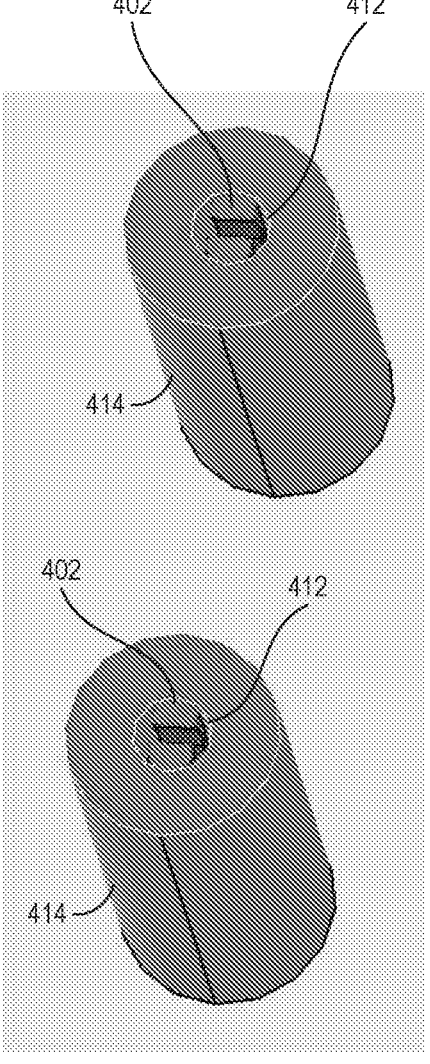

FIGS. 4A-4H illustrate embodiments of assemblies that include press-fit fasteners 402 and 416 in accordance with aspects of this disclosure. FIGS. 4A-4D illustrate a first embodiment. FIG. 4A illustrates a circuit board 404 and a component 406 that can be connected via the press-fit fastener 402. FIG. 4B illustrates the press-fit fasteners 402 arranged prior to fully inserting the press-fit fasteners 402 for securing the circuit board 404 and the component 406 together. FIG. 4C illustrates the circuit board 404 secured to the component 406 via the press-fit fasteners 402. FIG. 4D illustrates a perspective cross-sectional view of the press-fit fastener 402 when secured in a standoff 414.

Figure 4E:
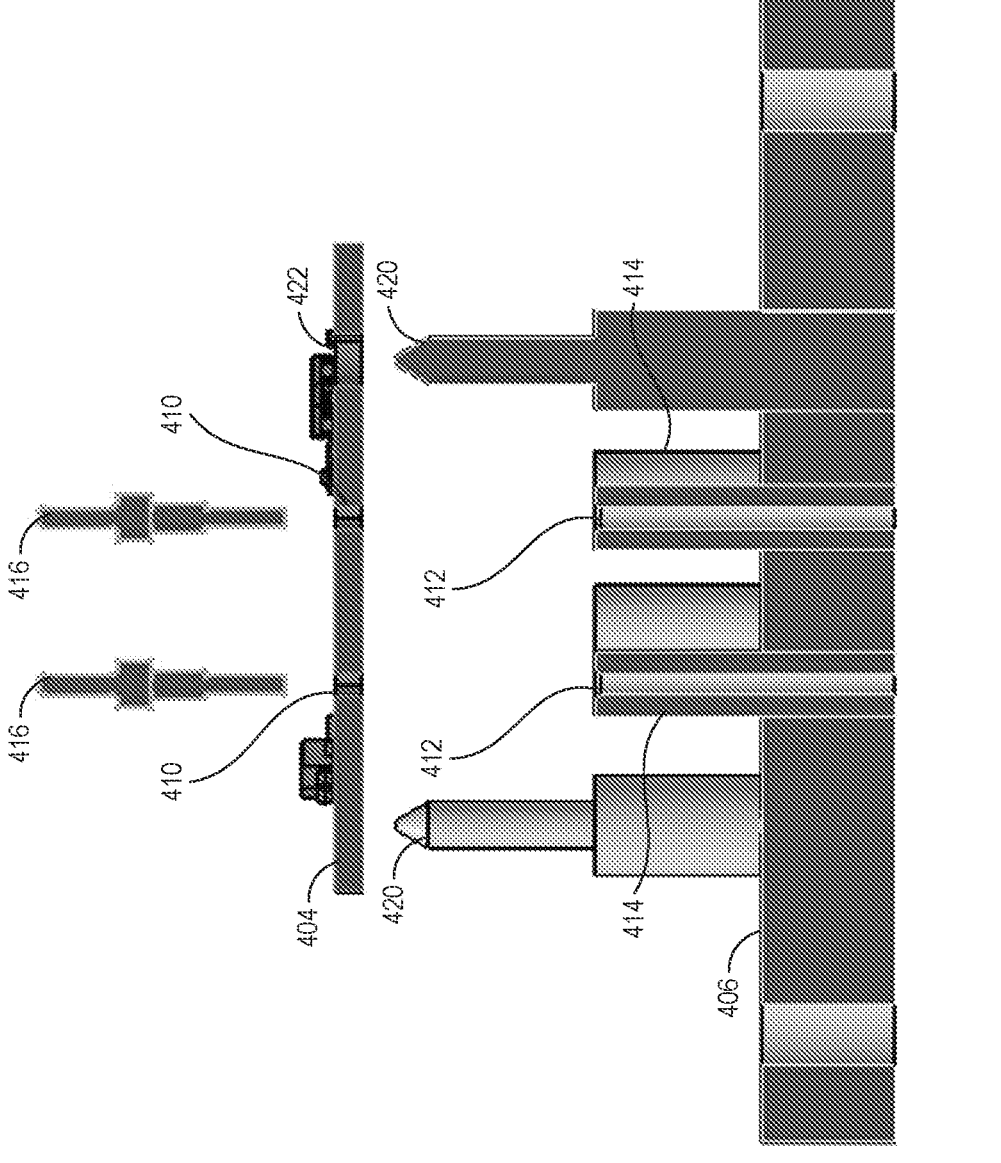
Figure 4F:
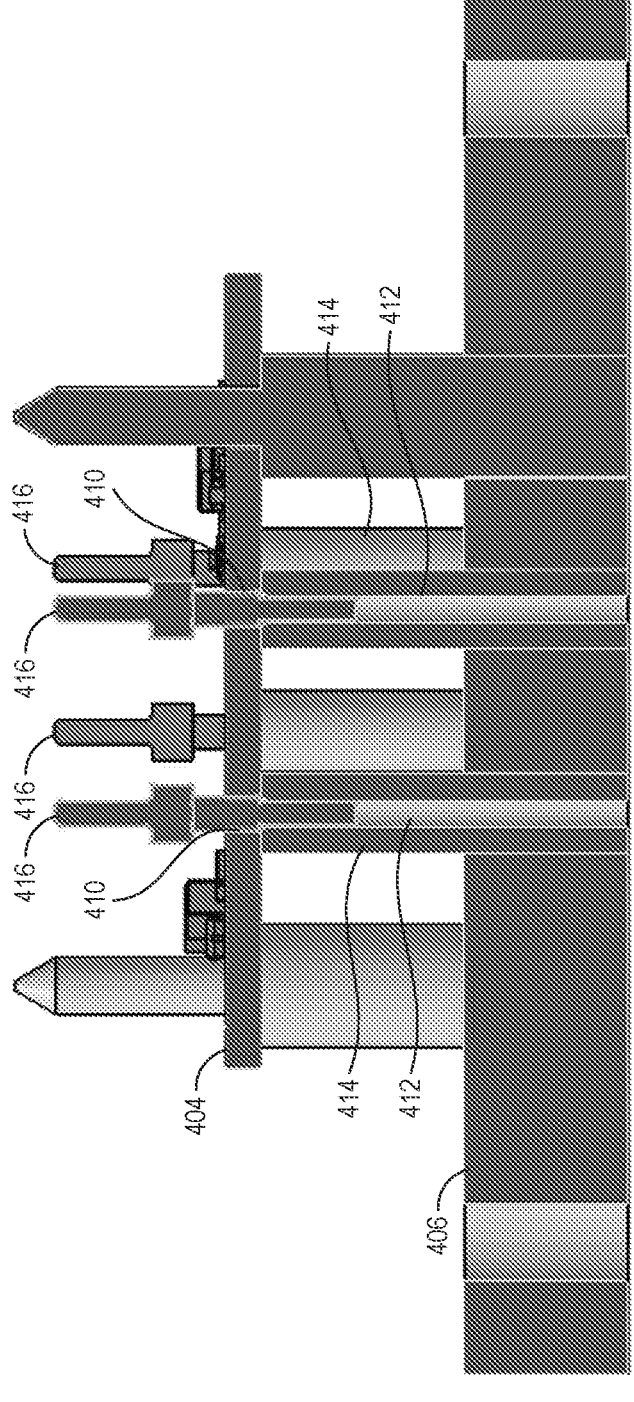
Figure 4G:
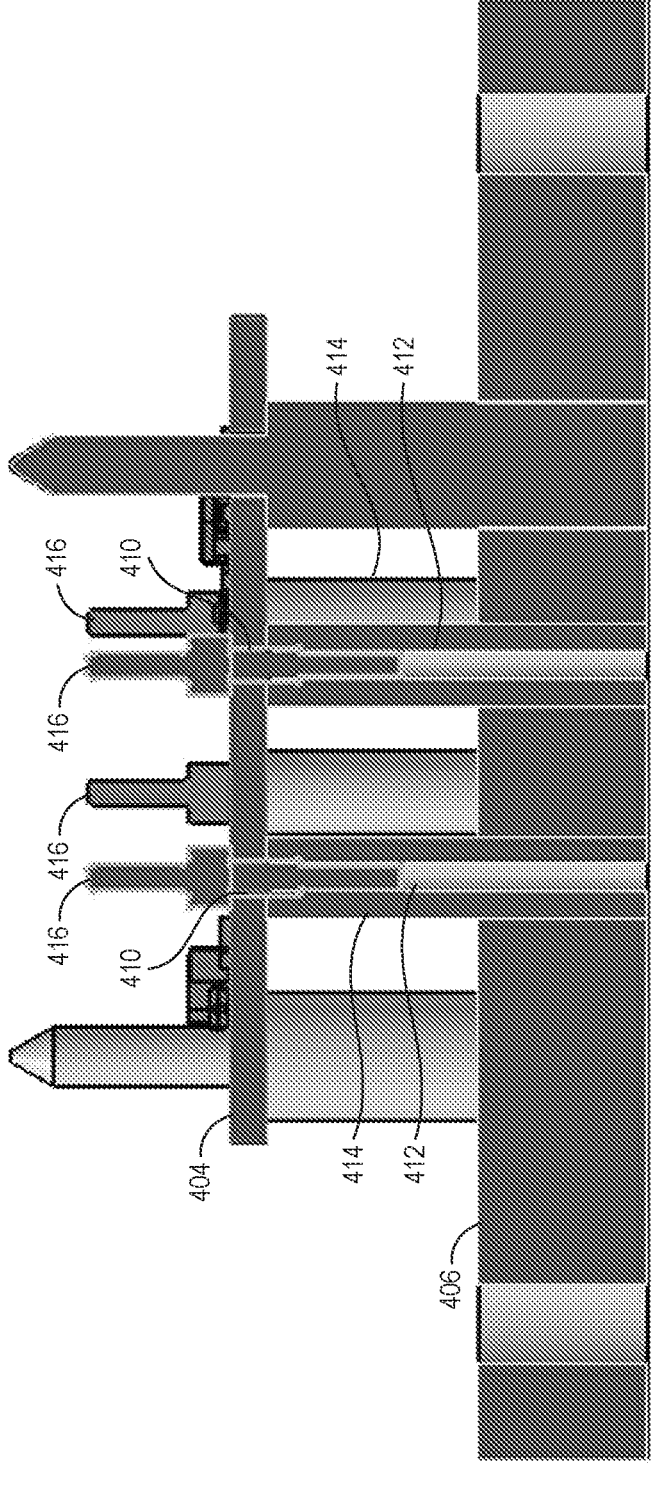
Figure 4H:
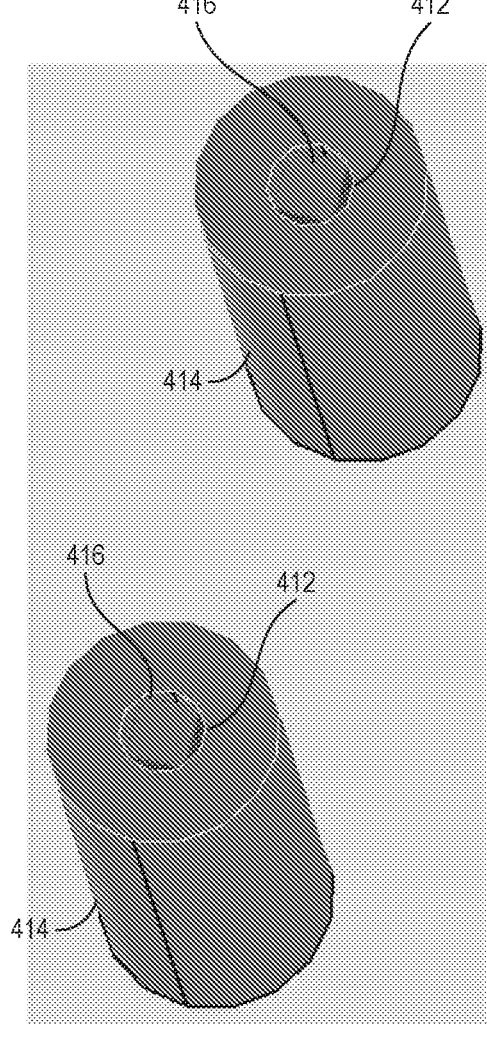

FIGS. 4E-4H illustrate a second embodiment. FIG. 4E illustrates a circuit board 404 and a component 406 that can be connected via the press-fit fasteners 416. FIG. 4F illustrates the press-fit fasteners 416 arranged above the circuit board 404 and the component 406 prior to fully inserting the press-fit fasteners 416 for securing the boards 404 and 406 together. FIG. 4G illustrates the circuit board 404 secured to the component 406 via the press-fit fasteners 416. FIG. 4D illustrates a perspective cross-sectional view of the press-fit fastener 416 when secured in a standoff 414.

With reference to FIGS. 4A-4D, the press-fit fastener 402 is configured to be inserted through both a first hole 410 in the circuit board 404 and a second hole 412 in a standoff 414 on the component 406 using a single pressing operation. For example, the first and second holes 410 and 412 can be aligned with each other (e.g., using an alignment post 420 and hole 422 as shown in FIG. 4A), and the press-fit fastener 402 can then be pressed into both holes 410 and 412 in a single pressing motion. The use of a single pressing operating may be faster, easier, and/or less complex than implementations that use two or more pressing operations, leading to more efficient manufacturing.

As shown in FIGS. 4A-4D, the press-fit fastener 402 includes two eyelets arranged adjacent to each other. These eyelets can be referred to as tandem eyelets. The press-fit fastener 402 can be referred to as a tandem press-fit fastener. The lower eyelet of the press-fit fastener 402 is configured to be inserted through the first hole 410 and into the second hole 412, and the upper eyelet is configured to be inserted into the first hole 410. This can result in a cold welding at locations where the press-fit fastener 402 is deformed. The eyelets of the press-fit fastener 402 are configured to be compressed when inserted into one of the holes 410 and 412. Due to the compression of the eyelets when inserted into the holes 410 and 412, the press-fit fastener 402 can be elastically deformed and exert a force on the corresponding hole 410 or 412 that helps maintain the press-fit fastener 402 within the holes 410 and 412. The press-fit fastener 402 can include conductive material. The longest dimension of the press-fit fastener 402 can be shorter than the diameter of a quarter coin. FIG. 4C shows tandem press-fit pins pressed all the way into the PCBA until the hard stop (cross) is reached.

Depending on the implementation, the upper and lower eyelets of the press-fit fastener 402 may have substantially the same width or the lower eyelet may have a smaller width than the tipper eyelet of the press-fit fastener 402. In some other embodiments, the lower eyelet may have a width that is greater than a width of the upper eyelet, so long as the lower eyelet can be inserted through the hole 410.

With reference to FIGS. 4E-4H, each of the press-fit fasteners 416 is configured to be inserted through both a first hole 410 in the circuit board 404 and a second hole 412 in a standoff 414 on the component 406 using a single pressing operation. For example, the first and second holes 410 and 412 can be aligned with each other (e.g., using an alignment post 420 and hole 422 as shown in FIG. 4E). Then the press-fit fastener 416 can be pressed into both holes 410 and 412 in a single pressing motion. The use of a single pressing operating/motion may be faster, easier, and/or less complex than implementations that use two or more pressing operations, leading to more efficient manufacturing.

As shown in FIGS. 4E, 4F, 4G, and 4H, the press-fit fastener 416 includes a lower portion sized to fit within the holes 410 and 412. An upper portion of the press-fit fastener 416 may be sized to prevent the fastener 416 from being inserted into the holes 410 and 412 beyond a defined depth. At least one cross-sectional dimension of the lower portion of the press-fit fastener 416 may be larger than a corresponding dimension of the holes 410 and 412 prior to insertion into the holes 410 and 412. For example, the distance between opposing corners of the lower portion of the press-fit fastener 416 can be larger than the diameter of the holes 410 and 412 prior to insertion. In the embodiment of FIGS. 4E-411, the lower portion of the press-fit fastener 416 may have two different cross-sectional diameters including a distal end having a smaller diameter than a proximal end of the lower portion of the press-fit fastener 416. The distal end of the lower portion of the press-fit fastener 416 may be sized to guide the press-fit fastener 416 into the holes 410 and 412, while the proximal end of the lower portion of the press-fit fastener 416 may be sized to be deformed when the fastener 416 is inserted into at least the hole 410, with the resulting force from the deformation securing the press-fit fastener 416 to the holes 410 and 412.

Figure 5A:
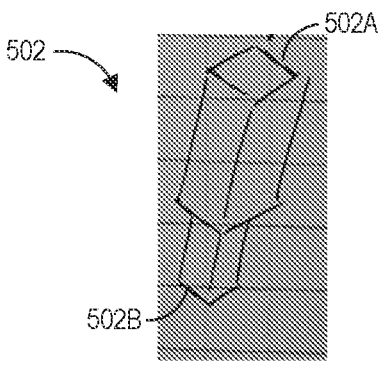
FIGS. 5A-5C illustrate an embodiment of a press-fit fastener configured to secure components together in accordance with aspects of this disclosure.
Figure 5B:
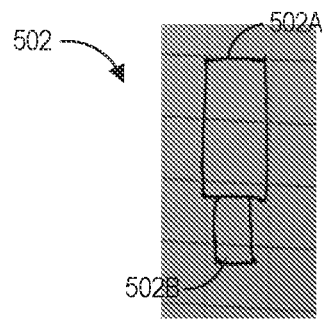
Figure 5C:
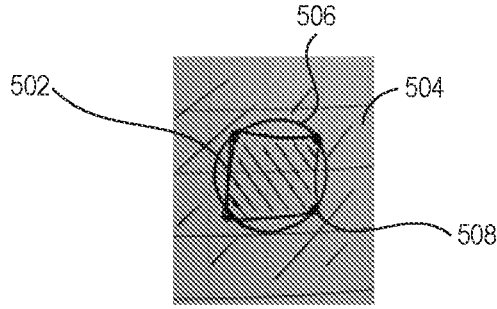

FIGS. 5A-5C illustrate an embodiment of a press-fit fastener 502 configured to secure components together in accordance with aspects of this disclosure. FIG. 5A is a perspective view of the press-fit fastener 502. FIG. 5B is a side view of the press-fit fastener 502. FIG. 5C is a cross-sectional view of the press-fit fastener 502 inserted into a hole 506 of a component 504. With reference to FIGS. 5A-5C, the press-fit fastener 502 can include an upper portion 502A and a lower portion 502B. The tipper portion 502 can be a main body portion. The lower portion 502B of the press fit-fastener 502 may be sized to fit within the hole 506 of the component 504. The tipper portion 502A of the press-fit fastener 502 may be sized to prevent the fastener from being inserted into the hole 506 beyond a defined depth (e.g., the length of the lower portion 502B). The upper portion 502A of the body can additionally be used as a grounding point or electrical terminal blade for an external connector assembly or harness.

At least one cross-sectional dimension of the lower portion 502B of the press-fit fastener 502 may be larger than a corresponding dimension of the hole 506 prior to insertion. For example, as shown in FIG. 5C the distance between opposing corners of the lower portion 502B of the press-fit fastener 502 can be larger than a diameter of the hole 506 prior to insertion. Due to this larger dimension of the press-fit fastener 502, the lower portion 502B of the press-fit fastener 502 may be deformed when the press-fit fastener 502 is inserted into the hole 506. In certain embodiments, the force of inserting the press-fit fastener 502 into the hole 506 can result in cold welding at the locations 508 at which the press-fit fastener 502 is deformed, thereby securing the press-fit fastener 502 to the hole 506. This cold welding can also occur in other embodiments including the eyelet-type press-fit fasteners described herein (e.g., see at least FIGS. 2A, and 2C-4D and the corresponding description) as well. Cold welding can be used to improve the long-term reliability of the joint. Thus, the cold welding of the press-fit fastener may result from the use of any press-fit fastener described herein, depending on the particular implementation. The securing of the press-fit fastener 502 to the component 504 can be accomplished using other geometries for both the press-fit fastener 502 and a hole 506 in the component 504. Accordingly, aspects of this disclosure are not limited to the illustrated geometries and any other suitable shapes/geometries can be used for the press-fit fastener 502 and/or the hole 506 in the component 504 without departing from the disclosure.

Figure 6A:
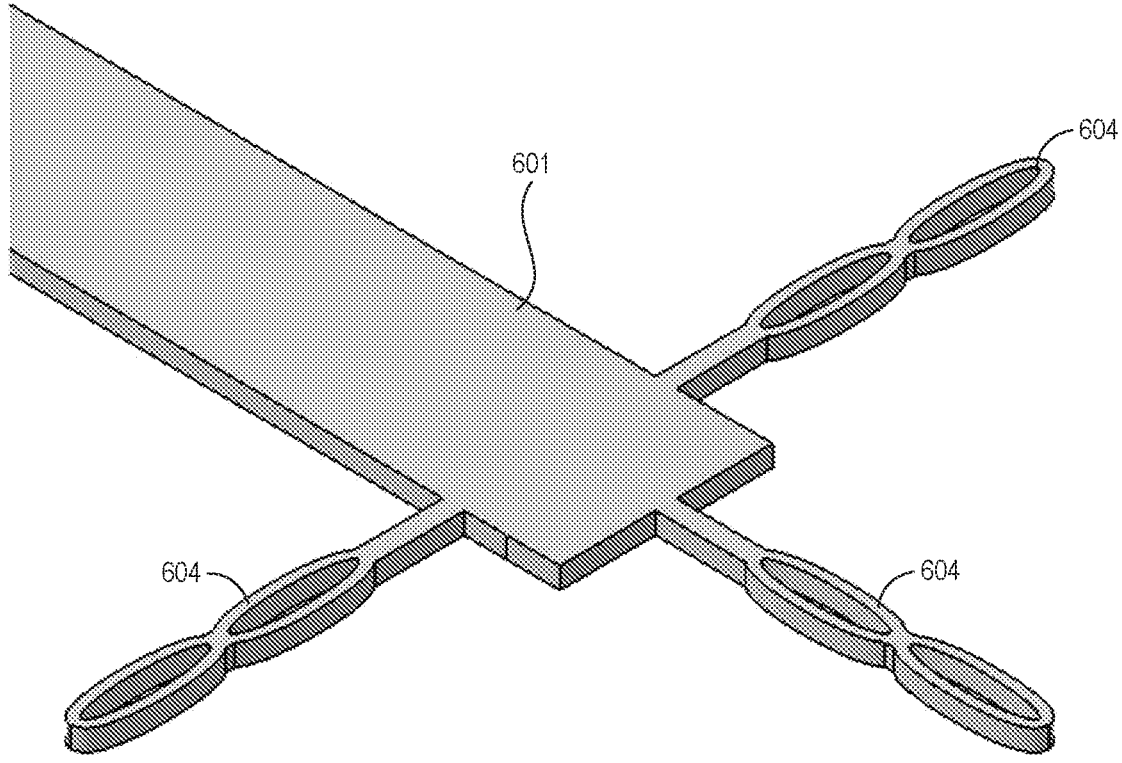
FIGS. 6A-6B illustrate an embodiment of a bus bar including a plurality of press-fit fasteners configured to secure a circuit board to a component in accordance with aspects of this disclosure.
Figure 6B:
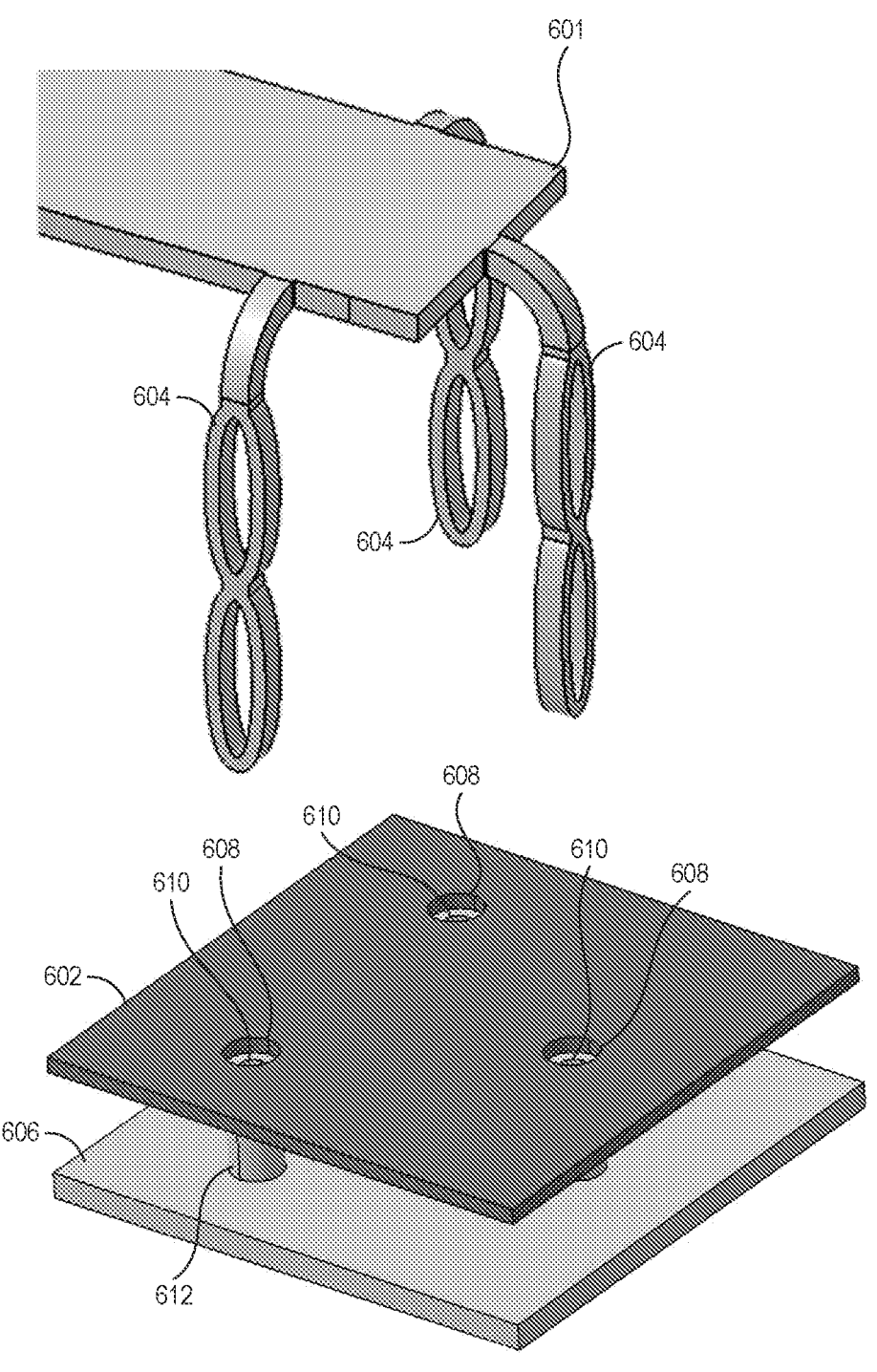

FIGS. 6A and 6B illustrate an embodiment of a bus bar 601 including a plurality of press-fit fasteners 604 configured to secure a circuit board 602 to a component 606 in accordance with aspects of this disclosure. FIG. 6A is a top view of the bus bar 601 in a first state. FIG. 6B is a perspective view of the bus bar 601 with the press-fit fasteners 604 folded prior to insertion into holes 608 and 610 in the circuit board 602 and standoffs 612 of the component 606. FIG. 6A illustrates press-fit fasteners 604 connected to the bus bar 601 before bending.

As shown in FIG. 6A, the bus bar 601 includes a plurality of press-fit fasteners 604. As shown in the illustrated embodiment, the bus bar 601 and the press-fit fasteners 604 may be formed from the same material. For example, this bus bar 601 and the press-fit fasteners 604 can be cut from a single piece of sheet metal to form the shape shown in FIG. 6A. The bus bar 601 can be bent along a plurality of bend lines (not illustrated) so that press-fit fasteners 604 point in a downward direction as shown in FIG. 6B. Each of the press-fit fasteners 604 can be inserted into corresponding holes 608 and 610 formed in the circuit board 602 and the standoffs 612, thereby securing the circuit board 602 to the component 606. A cold weld can occur at a fastener-to-hole interference. The component 606 can be a heatsink in certain applications.

Each of the press-fit fasteners 604 may have two eyelets that are configured to be compressed when inserted into one of the holes 608 and 610. Due to the compression of the eyelets when inserted into the holes 608 and 610, the press-fit fastener 604 can be elastically deformed and exert a force on the holes 608 and 610 that helps maintain the press-fit fastener 604 within the holes 608 and 610, thereby securing the circuit board 602 to the component 606. In some embodiments, the shape of the each of the eyelets may be substantially similar to the shape of the eye of a needle.

Figure 7B:
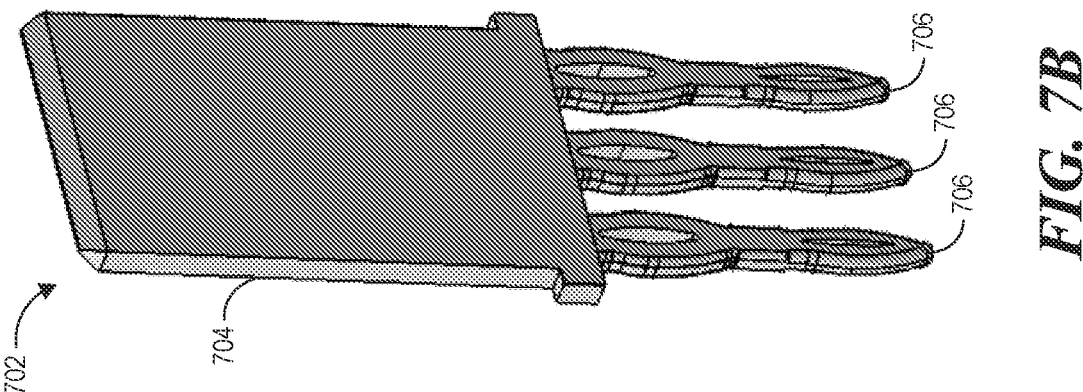
FIGS. 7A-7C illustrate an embodiment of a press-fit fastener configured for use as an electrical terminal or sliding terminal and a related assembly in accordance with aspects of this disclosure.
Figure 7A:
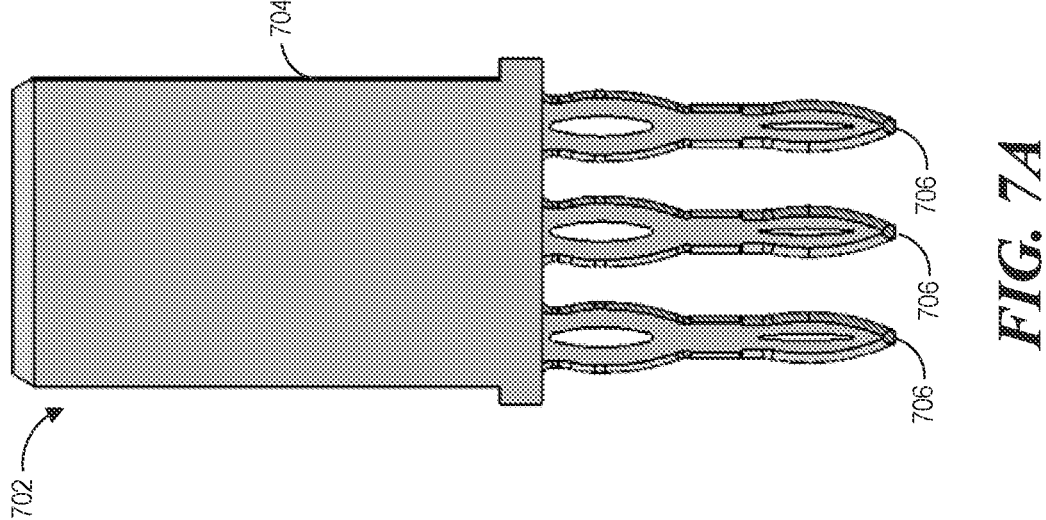
Figure 7C:
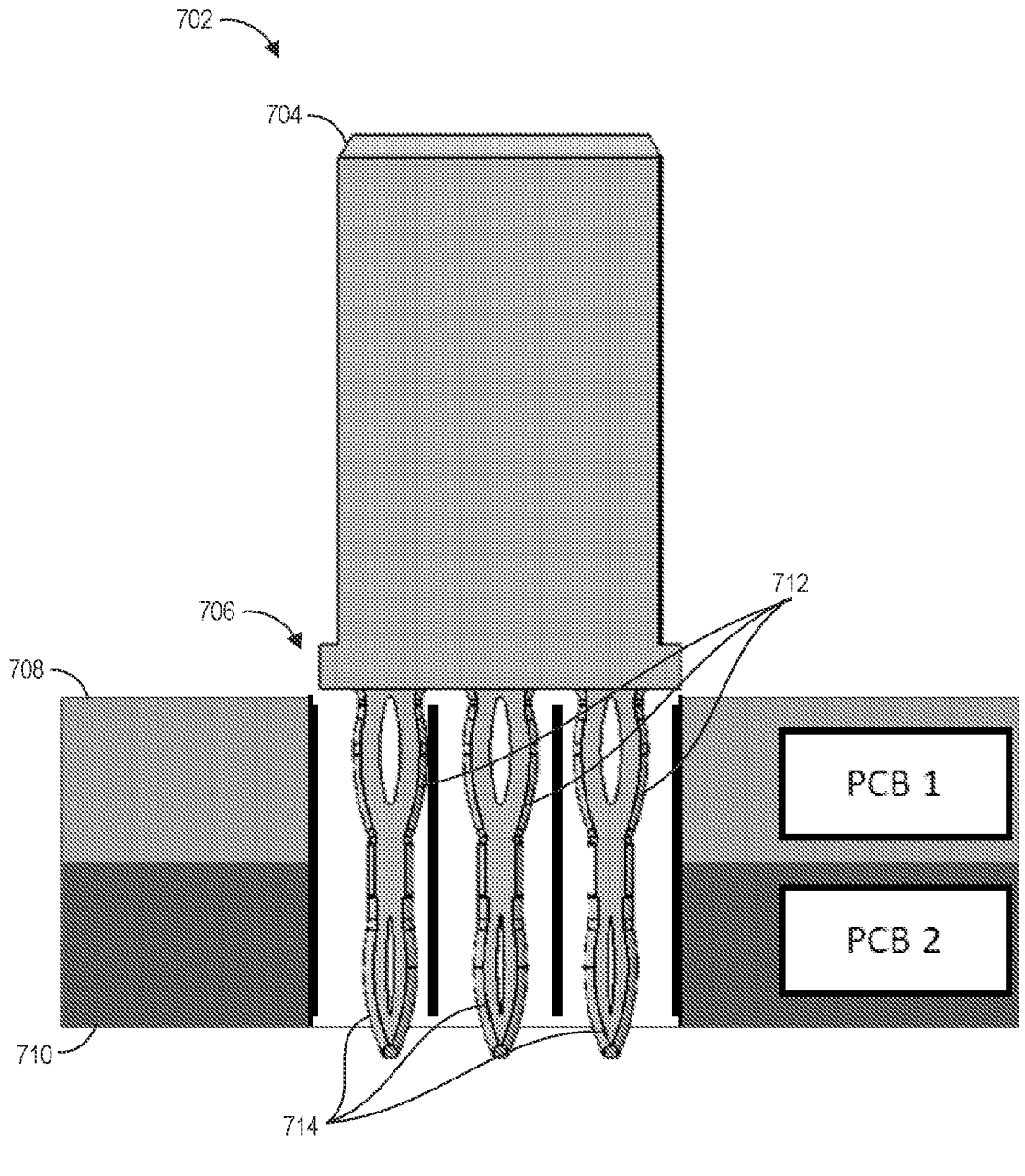

FIGS. 7A-7C illustrate an embodiment of a press-fit fastener 702 configured for use as an electrical terminal or sliding terminal in accordance with aspects of this disclosure. As shown in FIGS. 7A, 7B, and 7C, the press-fit fastener 702 includes a body (or head) 704 and a plurality of lower portions 706 each including two eyelets, for example, three lower portions 706 in the illustrated embodiment. As shown in FIG. 7C, each of the lower portions 706 may be inserted into corresponding holes 712 and 714 formed in a circuit board 708 and a component 710, respectively. The press-fit fastener 702 can be used to form electrical connections between the circuit board 708 and the component 710 and the body 704 of the press-fit fastener 702 can function as an electrical terminal or grounding point (e.g., for a connector harness, a flexible printed circuit board assembly (FPCBA)/ribbon cable, etc.). In certain applications, the component 710 can be a second circuit board. The press-fit faster 702 can provide electrical connections between circuit boards in such applications.

Figure 8B:
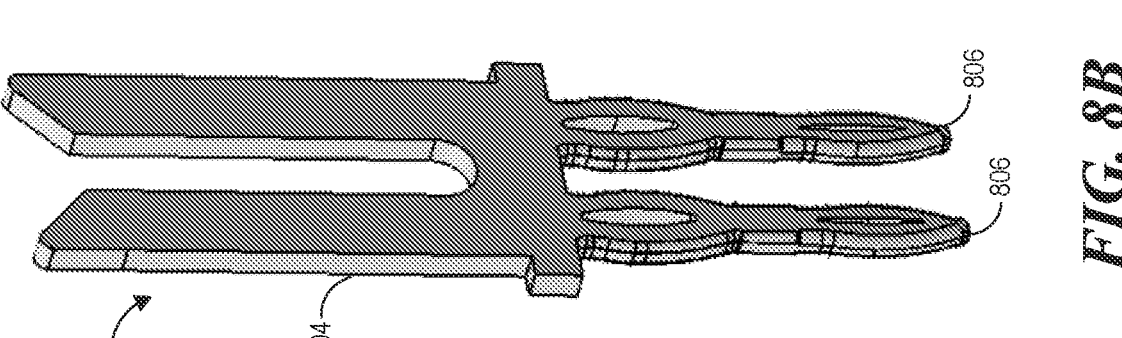
FIGS. 8A-8C illustrate another embodiment of a press-fit fastener configured for use as an electrical terminal or sliding terminal and a related assembly in accordance with aspects of this disclosure.
Figure 8A:
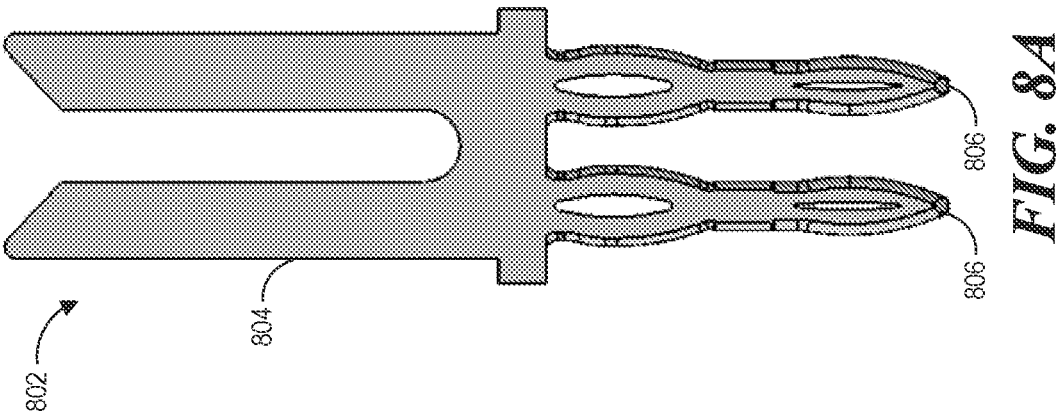
Figure 8C:
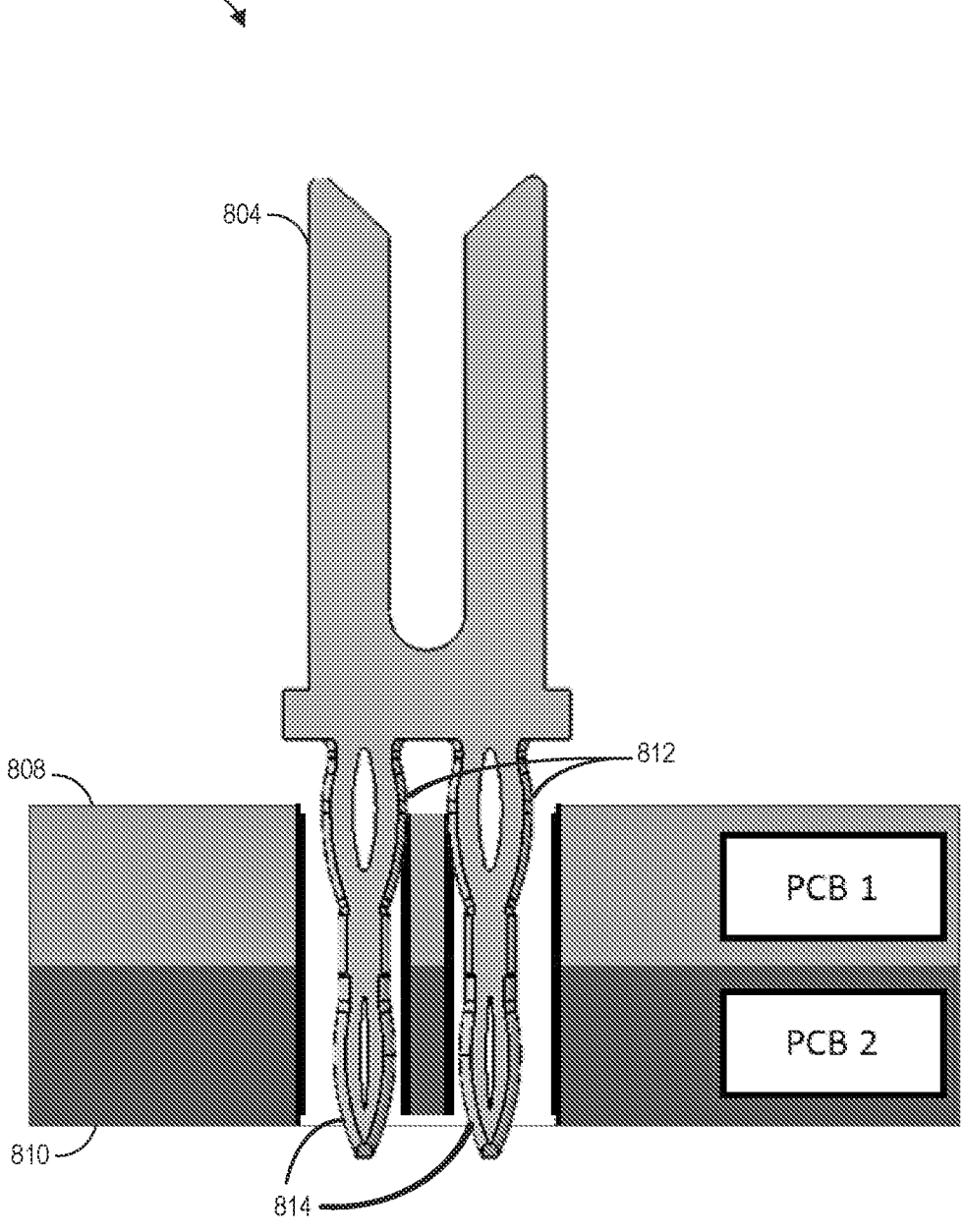

FIGS. 8A-8C illustrate another embodiment of a press-fit fastener 802 configured for use as an electrical terminal or sliding terminal in accordance with aspects of this disclosure. The embodiment of the press-fit fastener 802 illustrated in FIGS. 8A, 8B, and 8C may be substantially similar to the embodiment of FIGS. 7A-7C, with a differently shape body 804 and a different number of lower portions 806 (e.g., two in the embodiment illustrated in FIGS. SA-8C). The body 804 of the press-fit fastener 802 may be shaped to connect to a grouping point or electrical connector. The body 804 is generally fork sharped. Each of the lower portions 806 may be inserted into corresponding holes 812 and 814 formed in a circuit board 808 and a component 810. In certain applications, the component 810 can be a second circuit board. The press-fit fasteners 802 can provide electrical connections between circuit boards in such applications.

CONCLUSION

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed press-fit fastener assembly. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising" "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other. Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. An electronic system assembly, comprising:
   a first component comprising a first hole;
   a second component comprising a second hole; and
   a press-fit fastener configured to be inserted into the first hole and the second hole in a single motion, at least part of the press-fit fastener being positioned in the first hole and the second hole, wherein the press-fit fastener at least contributes to securing the first component to the second component,
   wherein the press-fit fastener comprises an upper insertable portion and a lower insertable portion, the upper insertable portion having a first cross-sectional dimension and configured to engage with the first hole, and the lower insertable portion having a second cross-sectional dimension different from the first cross-sectional dimension and configured to engage with the second hole, and wherein the press-fit fastener has a deformable geometry configured to generate outward force on each of the first and second holes, and wherein the upper and lower insertable portions of the press-fit fastener are eyelets.

2. The electronic system assembly of claim 1, wherein the eyelets are arranged adjacent to each other.

3. The electronic system assembly of claim 1, wherein at least one of the first and second cross-sectional dimensions is larger than a diameter of the first hole and is also larger than a diameter of the second hole.

4. The electronic system assembly of claim 1, wherein the press-fit fastener has a body sized to prevent the press-fit fastener from being inserted into the first and second holes beyond a defined depth.

5. The electronic system assembly of claim 1, wherein the press-fit fastener has an upper end configured as a grounding point or electrical terminal blade.

6. The electronic system assembly of claim 1, wherein:

the first component comprises a plurality of first holes, the first holes comprising the first hole, the second component comprises a plurality of second holes, the second holes comprising the second hole, and the assembly comprises a plurality of press-fit fasteners each configured to be inserted into a corresponding one of each of the first holes and the second holes in a single motion, each of the press-fit fasteners including a portion positioned in the corresponding one of each of the first holes and second holes, and the press-fit fasteners comprising the press-fit fastener.

7. The electronic system assembly of claim 1, wherein the press-fit fastener comprises electrically conductive material.

8. The electronic system assembly of claim 1, wherein the second component comprises a circuit board.

9. The electronic system assembly of claim 8, wherein the first component comprises at least one of: a heat sink, a standoff for a heat sink, a bus bar, or a second circuit board.

10. The electronic system assembly of claim 1, wherein the first component comprises a standoff for a heat sink and the second component comprises a printed circuit board assembly.

11. The electronic system assembly of claim 1, wherein the press-fit fastener comprises electrically conductive material and is configured as a grounding point.

12. A press-fit fastener for securing components together, the press-fit fastener comprising:

a body; and a lower portion configured to be inserted into a first hole in a first component and a second hole in a second component in a single motion, the press-fit fastener configured to at least contribute to securing the first component to the second component when the lower portion of the press-fit fastener is positioned in the first and second holes, wherein the lower portion comprises:

an upper insertable portion with a first cross-sectional dimension and configured to engage with the first hole; and a lower insertable portion with a second cross-sectional dimension different from the first cross-sectional dimension configured to engage with the second hole, and wherein the upper and lower insertable portions are configured to be compressed when inserted into the first and second holes so as to exert force on the first and second holes, and wherein the upper and lower insertable portion are eyelets.

13. The press-fit fastener of claim 12, wherein the eyelets are arranged adjacent to each other.

14. The press-fit fastener of claim 12, wherein at least one of the first and second cross-sectional dimensions is larger than a diameter of the first hole and also larger than a diameter of the second hole.

15. The press-fit fastener of claim 12, wherein the body is sized to impede the press-fit fastener from being inserted into the first and second holes beyond a defined depth.

16. A method of manufacture, comprising:

inserting at least part of a press-fit fastener through a first hole in a first component and a second hole in a circuit board in a single motion, the press-fit fastener at least contributing to securing the circuit board to the first component after insertion into the first and second holes, wherein the press-fit fastener comprises a first insertable portion with a first cross-sectional dimension and configured to engage with the first hole and a second insertable portion with a second cross-sectional dimension different from the first cross-sectional dimension configured to engage with the second hole, wherein the first and second insertable portions of the press-fit fastener are compressed during the inserting so as to exert force on the first and second holes, and wherein the upper and lower insertable portion are eyelets.

17. The method of claim 16, further comprising inserting each of a plurality of additional press-fit fasteners into respective holes of the first component and the circuit board in a single motion.

* * * * *